United States Patent [19]

Tochizawa et al.

[11] Patent Number: 5,041,570

[45] Date of Patent: Aug. 20, 1991

[54] PHOTOSENSITIVE 4,4′-DIAZIDOSTILBENE DERIVATIVE

[75] Inventors: Noriaki Tochizawa, Funabashi; Hideo Kikuchi, Chiba, both of Japan

[73] Assignee: Toyo Gosei Kogyo Co., Ltd., Japan

[21] Appl. No.: 387,940

[22] Filed: Jul. 31, 1989

[30] Foreign Application Priority Data

Aug. 3, 1988 [JP] Japan .................................. 63-192819
Sep. 12, 1988 [JP] Japan .................................. 63-226343
Dec. 2, 1988 [JP] Japan .................................. 63-304037

[51] Int. Cl.$^5$ .......................................... C07C 247/16
[52] U.S. Cl. ........................................ 552/8; 430/167; 430/194; 430/196; 430/197; 430/325
[58] Field of Search ............... 430/194, 197, 167, 196, 430/281, 325; 552/8

[56] References Cited

U.S. PATENT DOCUMENTS

| | | | |
|---|---|---|---|
| 3,143,416 | 8/1964 | Reichel et al. | 430/194 |
| 4,549,824 | 10/1985 | Sachdev et al. | 430/194 |
| 4,767,409 | 8/1988 | Grisdale et al. | 430/194 |
| 4,842,984 | 6/1989 | Serizawa et al. | 430/194 |
| 4,856,531 | 8/1989 | Grisdale et al. | 430/196 |

FOREIGN PATENT DOCUMENTS

| | | | |
|---|---|---|---|
| 1003620 | 1/1976 | Japan | 430/194 |
| 613590 | 6/1976 | U.S.S.R. | 522/8 |

*Primary Examiner*—Charles L. Bowers, Jr.
*Assistant Examiner*—John S. Y. Chu
*Attorney, Agent, or Firm*—Jordan B. Bierman

[57] ABSTRACT

A photosensitive agent comprising an aromatic diazide compound represented by Formula (I)

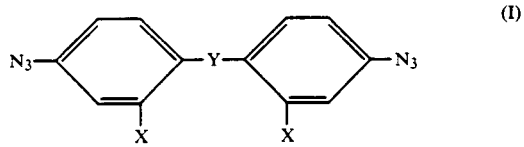

wherein
X denotes

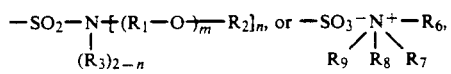

Y denotes —CH=CH—,

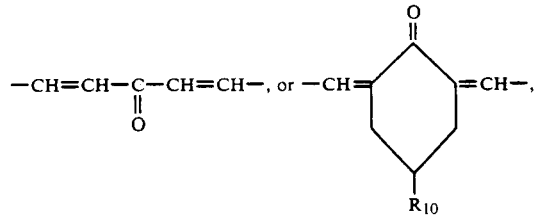

$R_1$ is —CH$_2$CH$_2$—, $R_2$ —CH$_2$CH$_3$, $R_3$ is hydrogen, m is 1, and n is 1, $R_6$, $R_7$, $R_8$, $R_9$, and $R_{10}$ are individually hydrogen, alkyl, substituted alkyl, aryl, or two of $R_6$ to $R_9$ form alkylene groups, provided that $R_6$ to $R_9$ are not all hydrogen simultaneously and use of the photosensitive agent in a photosensitive composition and in a method forming forming an image.

5 Claims, No Drawings

PHOTOSENSITIVE 4,4'-DIAZIDOSTILBENE DERIVATIVE

FIELD OF THE INVENTION

This invention relates to photosensitive agents which are highly soluble in solvents, especially in polar solvents, to a photosensitive resin composition containing the photosensitive agent, and to a method of image formation using the photosensitive resin composition.

BACKGROUND OF THE INVENTION

Photosensitive resin compositions, which are developable with an aqueous developing solution, comprising a water-soluble aromatic azide compound having a sulfonic acid radical and a binder resin have a wide variety of uses including printing applications such as offset printing, screen printing, and proof printing; electronic material applications such as color filters, block matrices, and printed circuits; and immobilization of biocatalysts.

Aromatic azide compounds having a sulfonic acid radical, which have heretofore been used, include sulfonic acids, and alkali or ammonium salts thereof, typically represented by the following formulas.

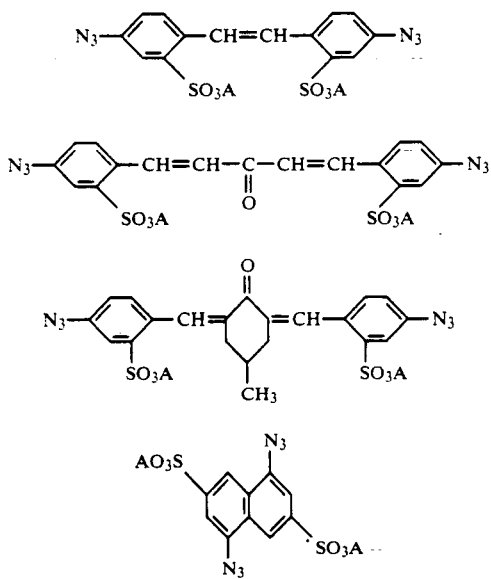

wherein, A indicates H, Na, K, or NH4.

However, sodium, potassium, or ammonium salt of 4,4'-diazidostilbene-2,2'-disulfonic acid as one of the above photosensitive agents has problems in that it is less soluble in polar solvents such as water, alcohol, cellosolve, dimethylformamide, dioxane, or mixtures thereof, is less compatible with binder resins and, on water developing, undergoes considerable swelling which impairs resolution.

Furthermore, of compounds represented by the above general formulas, sulfonic acids (in which A=H) are highly soluble, but are strongly acidic and, when used for metallic substrates, corrode the metals or require a corrosion-resistant coating, which largely limits their applications.

The alkali metal salts of such acids have problems in that the solubility changes with the pH value of the solution or with crystal configuration. Moreover, these salts cannot be used for electronic materials.

SUMMARY OF THE INVENTION

With a view to eliminate the above prior art problems, it is a primary object of the present invention to provide a photosensitive agent, a photosensitive resin composition using the photosensitive agent, and a method for image formation using the photosensitive resin composition, all of which do not have any of the foregoing problems.

With the aim of attaining the above object, the inventors of the present subject matter have conducted intensive research, and have found that use of an aromatic azide compound having a specific structure provides a photosensitive agent which does not contain metals, is highly soluble in polar solvents such as ethylcellosolve, has good compatibility with binder resins, and undergoes reduced swelling on development with water to give high resolution. This compound is used in a photosensitive resin composition which, in return, is used in the inventive image formation method.

In accordance with the present invention, there is provided a photosensitive agent comprising an aromatic diazide compound of Formula (I)

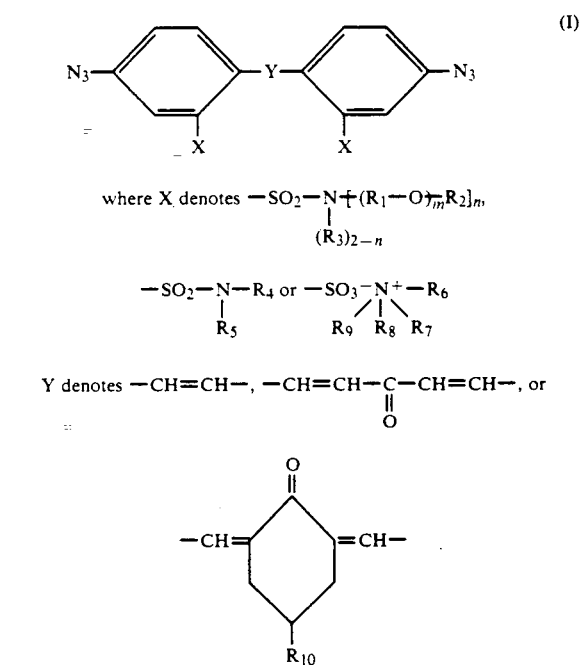

$R_1$ is a substituted or unsubstituted alkylene group, $R_2$ and $R_3$ indicate hydrogen or lower alkyl groups, m is 1, 2 or 3, n is 1 or 2, $R_4$ is a substituted or unsubstituted alkyl group having 4 to 20 carbon atoms, $R_5$ indicates hydrogen or a substituted or unsubstituted alkyl group having 20 or less carbon atoms, $R_6$, $R_7$, $R_8$, $R_9$, and $R_{10}$ indicate hydrogen, alkyl groups, substituted alkyl groups, aryl groups, or alkylene groups formed from two of $R_6$ to $R_9$. However, $R_6$ to $R_9$ are not all hydrogen simultaneously.

Among the above-described photosensitive agents of Formula (I), those represented by general Formulas (II) to (IV) are particularly preferable.

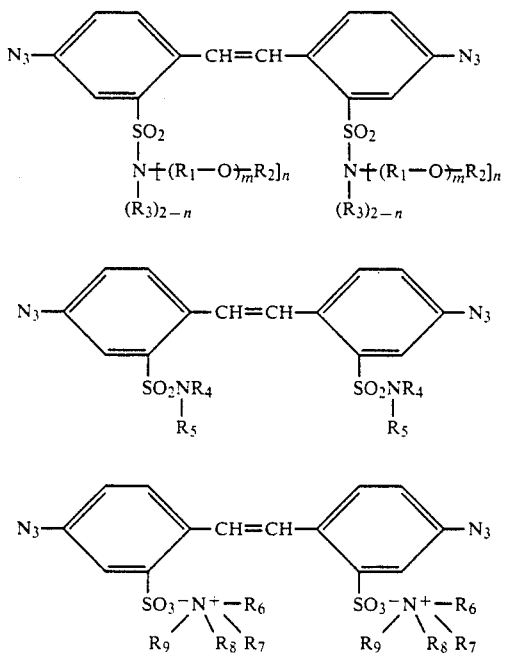

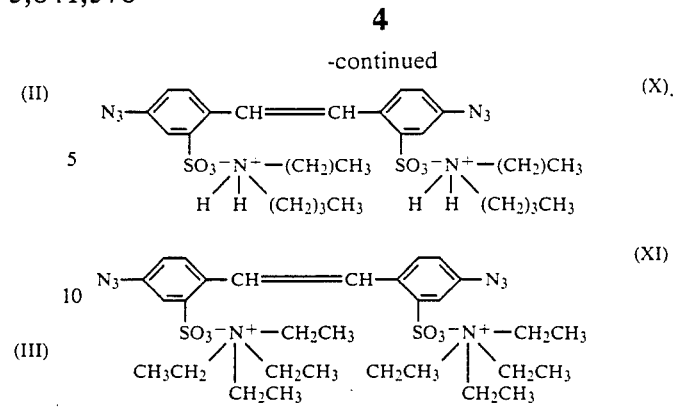

Specifically, these preferable photosensitive agents include those of Formulas (V) to (XI):

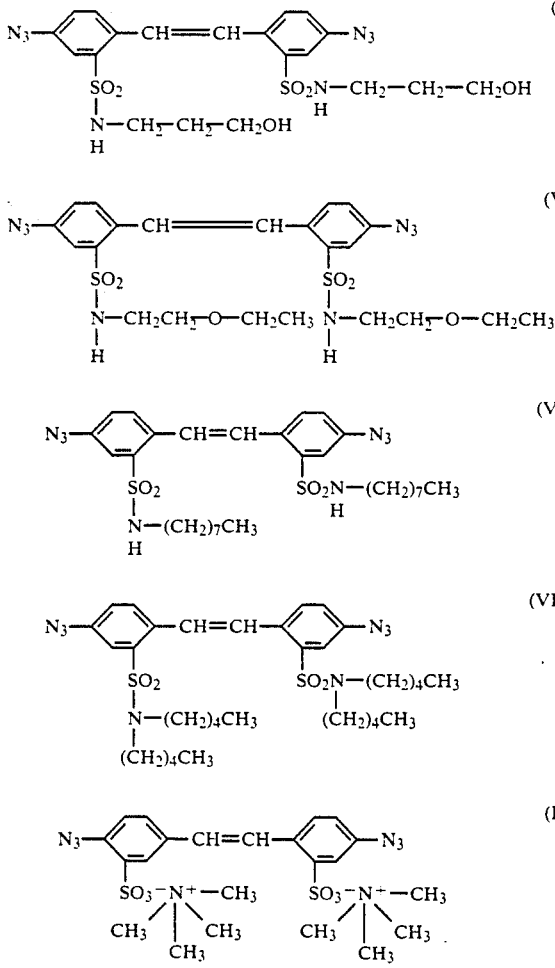

There is also provided, according to the present invention, a photosensitive resin composition which can be developed by an aqueous developing agent, characterized in that the photosensitive agent is an aromatic diazide compound of Formula (I), Formulas (II) to (IV) being preferable.

DETAILED DESCRIPTION OF THE INVENTION

As amides similar to the aromatic azide compound of Formula (I), there are known, for example, the arylamides disclosed in U.S. Pat. No. 3,092,494. However, these compounds are less soluble in polar solvents such as ethylcellosolve, and are impossible or very difficult to develop with water. Sulfonic acid esters have also been investigated, but have been found to be inferior in terms of solubility and developability. However, it has been found that aromatic diazide compounds represented by Formulas (I) specifically are highly soluble in polar solvents such as ethylcellosolve, have good compatibility with binder resins, and are compatible with aqueous development.

The aromatic azide compound represented by Formula (II) or (III) is obtained, using a procedure similar to that described in U.S. Pat. No. 3,092,494, by converting 4,4'-diazido-stilbene-2,2'-disulfonic acid into 4,4'-diazidostilbene-2,2'-disulfonylchloride. The sulfonylchloride is reacted with an amine of Formula (5) or (6) in the presence of a solvent and an inorganic alkali such as sodium hydroxide, sodium carbonate, potassium carbonate, or an organic amine such as triethylamine or pyridine, or an excess of the amine itself.

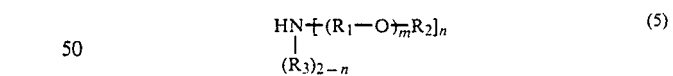

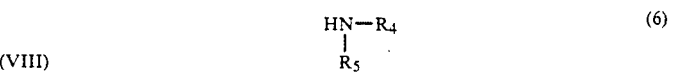

The solvent may be selected from hydrocarbons such as dichloromethane, dichloroethane, and chloroform; alcohols such as methanol, ethanol, and propanol; ketones such as acetone, methylethylketone, and cyclohexanone; ethers such as diethylether, dioxane, and tetrahydrofuran; esters such as ethyl acetate and butyl acetate; and amides such as dimethylformamide and dimethylacetamide. The reaction temperature and time, although depending on the type of the amine, solvent, and/or catalyst, are typically within the range from 0° to 150° C., and 10 hours, respectively.

The organic amine salts of the present invention include compounds represented by Formulas (7) to (9):

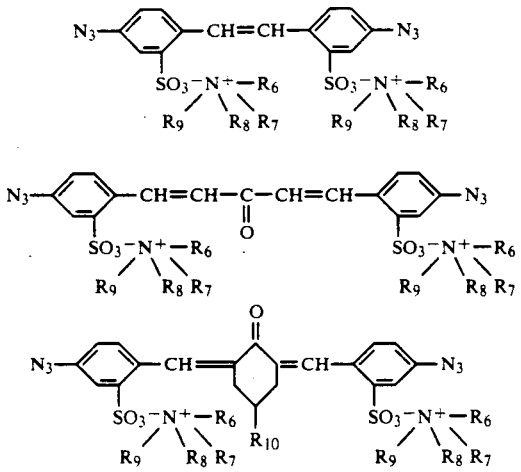

In the above formulas, $R_1$, $R_2$, $R_3$, $R_4$, $R_5$, $R_6$, $R_7$, $R_8$, $R_9$, and $R_{10}$ may be same or different, and denote hydrogen, alkyl groups such as methyl, ethyl, propyl, butyl, pentyl, hexyl, and amyl; substituted alkyl groups such as hydroxyethyl and hydroxypropyl; aralkyl groups such as benzyl; and aryl groups such as phenyl; or two of $R_1$ to $R_4$, or of $R_5$ to $R_8$, may combine to form an alkylene group. However, neither $R_1$ to $R_4$ nor $R_5$ to $R_8$ should be hydrogen simultaneously.

Each of these azide compounds can readily be produced by neutralizing an aqueous solution of the corresponding azidosulfonic acid with an organic amine or quaternary ammonium hydroxide of an organic amine, followed by salting out or concentration. An azidosulfonic acid can easily be produced from its alkali metal salt by treating it with an acidic ion exchange resin.

Preferable organic amines include aliphatic amines such as trimethylamine, diethylamine, triethylamine, tributylamine, ethanolamine, and triethanolamine, alicyclic amines such as pyrrolidine and piperidine, aromatic amines such as pyridine and aniline, and quaternary ammonium compounds such as tetramethylammonium hydroxide, tetrabutylammonium hydroxide, N,N-dimethyl- piperidinium hydroxide, and trimethylbenzylammonium hydroxide.

The inventive photosensitive resin compositions, which are developable with an aqueous developing solution, normally contain a resin having film-forming capability as a binder resin. The film-forming resin can be selected from conventional resins known in the art, for example, polyvinylalcohol, polyvinylpyrrolidone, polyacrylamide, polyvinylmethylether, polyvinylacetal, polyvinylacrylic acid, a copolymer of vinyl alcohol and vinylpyrrolidone, a copolymer of (meth)acrylate and (meth)acrylamide (Japanese Patent Publication Laid-open No. 59-191033/1984, Japanese Patent Publication Laid-open No. 51-103502/1976, Japanese Patent Publication Laid-open No. 63-10152/1988), a copolymer of (meth)acrylamide and 2-cyanoethyl (meth)acrylic ester (Japanese Patent Publication Laid-open No. 51-143318/1976), a copolymer of acrylamide and diacetoneacrylamide (Japanese Patent Publication Laid-open No. 49-68801/1974), a copolymer of vinyl alcohol and maleic acid (Japanese Patent Publication Laid-open No. 48-97602/1973), a grafted polyvinyl alcohol, a polyvinylalcohol-based resin containing an acetoacetic ester group or an aryl group (Japanese Patent Publication Laid-open No. 58-174942/1983), a co-polymerized polyamide having a sulfonate salt group (Japanese Patent Publication Laid-open No. 50-54403/1975), methylcellulose, carboxymethylcellulose, hydroxymethylcellulose, hydroxypropylcellulose, sodium poly-L-glutamate (Japanese Patent Publication Laid-open No. 48-90727/1973), gelatin, shellac, gum arabic, and casein.

The ratio of the aromatic azide compound to the binder resin is 1 to 100 parts by weight, preferably 3 to 20 parts by weight, of the aromatic azide compound to 100 parts by weight of the binder resin.

The photosensitive resin composition according to the present invention may also include a silicon compound to improve adhesion to the substrate and/or a surface active agent to improve the coating adaptability.

The photosensitive resin of the present invention, after coating onto the substrate to form a film, can be exposed to light and then developed with an aqueous developing agent to form an image. An example of the image formation method according to the present invention will now be described.

The photosensitive resin compound containing the photosensitive agent of the present invention is dissolved in a solvent such as water, alcohol, or ethylcellosolve. The resulting solution is coated onto a substrate such as a silicon wafer, glass, indium-tin-oxide, or alumina using, for example, a spinner or a roll coater to form the photosensitive film.

In the method of the present invention, the thus formed photosensitive film is exposed to a specified image. The film is then developed, for example, with water or an aqueous developing solution containing a small amount of alkali or alcohol, to form the desired image.

An aqueous developing solution useful in the present invention comprises, for example, 50% or less by weight of methanol, ethanol, acetone, dioxane, or tetrahydrofuran, based on the water present; or comprises 5% by weight of an inorganic alkali such as sodium hydroxide, potassium hydroxide, or sodium metaborate, and 5% by weight of an organic amine such as triethylamine, tetramethylammonium hydroxide, or triethanolamine, based on the water present.

The following examples are intended to illustrate, not limit, the invention.

Synthesis of photosensitive agents of Formula (II):

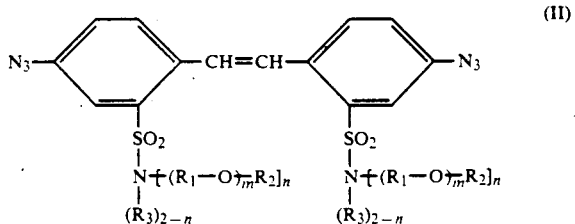

EXAMPLE 1

Synthesis of Amide No.1 (=Formula V)

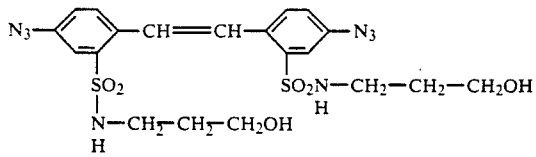

100 g (0.2211 mole) of 4,4′-diazidostilbene-2,2′-disulfonylchloride and 66.43 g (0.8844 mole) of 3-amino-1-propanol were dispersed in 400 ml of dimethylformamide. The mixture was stirred for about 2 hours at room temperature to accomplish the dissolution. This mixture was then poured into a mixture of 400 ml of water and 100 ml of methanol and crystals were deposited. The crystals were filtered and recrystallized from acetone to obtain Amide No.1. This amide had a melting point of 157° to 160° C. and an HPLC (high-pressure liquid chromatography) purity of 98.5%, and gave the following spectral data:

Infrared absorption spectra:
3500–3400 cm$^{-1}$: hydroxyl group
3330 cm$^{-1}$: amide group
3000–2900 cm$^{-1}$: propyl group
2120 cm$^{-1}$: azide group Nuclear magnetic spectra:
1.5–1.9 ppm (multiplet 4H: —CH$_2$—)
2.88 ppm (singlet 4H: —NH—. —OH)
2.90–3.24 ppm (triplet 4H: —CH$_2$—)
3.48–3.65 ppm (triplet 4H: —CH$_2$—)
6.6–8.0 ppm (multiplet 8H:

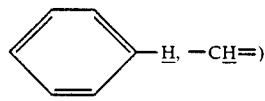

Ultraviolet absorption spectra:
$\lambda_{max}$: 336 nm
$\epsilon_{max}$: 36759

EXAMPLE 2

Amides No.2 to No.7 shown in Table 1 were synthesized using the same procedures as in Example 1.

TABLE 1

$$N_3-\bigcirc-CH=CH-\bigcirc-N_3$$

with SO$_2$—N+(R$_1$—O)$_m$R$_2$]$_n$ / (R$_3$)$_{2-n}$ on each ring

| Amide No. | R$_1$ | R$_2$ | R$_3$ | m | n |
|---|---|---|---|---|---|
| 2 | CH$_2$CH$_2$ | H | H | 1 | 1 |
| 3 | CH(CH$_3$)CH$_2$CH$_2$ | H | H | 1 | 1 |
| 4 | CH$_2$CH$_2$ | H | H | 2 | 1 |
| 5 | CH$_2$CH$_2$ | H | CH$_3$ | 1 | 1 |
| 6 | CH$_2$CH$_2$ | H | — | 1 | 2 |
| 7 | CH$_2$CH$_2$ | CH$_3$ | H | 2 | 1 |
| 8* | CH$_2$CH$_2$ | CH$_2$CH$_2$ | H | 1 | 1 |

*Amide No. 8 (= Formula VI)

Preparation and test examples of photosensitive resin compositions using the above-described photosensitive agents.

EXAMPLES 3–8

The respective Amides synthesized in Examples 1 and 2 in amounts shown in Table 2 are dissolved in a solution comprising 5 g of polyvinylpyrrolidone (average molecular weight: 320,000) dissolved in 106 g of ethylcellosolve, to evaluate their solubility.

Each resin composition was coated onto a sand-blasted aluminum plate to a thickness of 2.0 g/m$^2$ after drying, and dried at 80° C. for 20 minutes. The coated plate was exposed by a 1-kW metal halide lamp from a distance of 20 cm for 30 seconds and developed with water; its sensitivity was then measured using a step tablet method (Kodak step tablet No.2).

Further, the coated plate was evaluated for developability with water and checked for occurrence of swelling with water. The results are shown in Table 2.

As reference examples, results for photosensitive resin compositions using sodium and ammonium salts of 4,4′-diazidostilbene-2,2′-disulfonic acid and the following arylamide and ester as photosensitive agents are also shown.

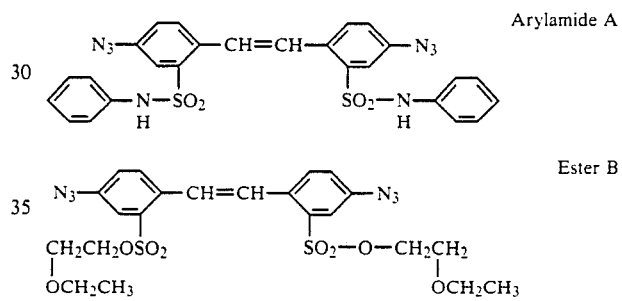

Arylamide A

Ester B

TABLE 2

| | Photosensitive agent | g | Solubility | Sensitivity** | Developability | Swelling |
|---|---|---|---|---|---|---|
| Ex. 3 | Amide No. 1 | 0.227 | Good | 13 | Good | None |
| 4 | Amide No. 2 | 0.215 | Good | 11 | Good | None |
| 5 | Amide No. 3 | 0.239 | Good | 12 | Good | None |
| 6 | Amide No. 4 | 0.254 | Good | 11 | Good | None |
| 7 | Amide No. 7 | 0.239 | Good | 12 | Good | None |
| 8 | Amide No. 8 | 0.239 | Good | 13 | Good | None |
| Ref. 1 | Arylamide A | 0.243 | Poor | — | — | — |
| 2 | Ester B | 0.239 | Good | 10 | partly undeveloped | None |
| 3 | Sodium salt | 0.2 | Fair* | 9 | Good | Present |
| 4 | Ammonium salt | 0.196 | Poor | — | — | — |

*Solubility varied with crystal form
**Gradation scale No. of Kodak step Table No. 2

It can be seen from Table 2 that the photosensitive resin compositions, using the photosensitive agents of the present invention, in contrast to the Reference Examples, are superior in solubility, sensitivity, and water-developability, and exhibited no swelling.

Synthesis Examples of Photosensitive Agents of Formula (III)

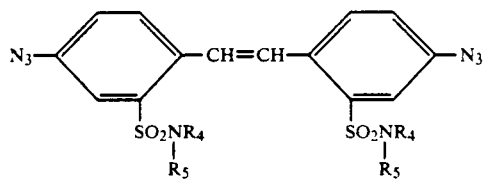
(III)

EXAMPLE 9

Synthesis of Amide No.9 (=Formula VII)

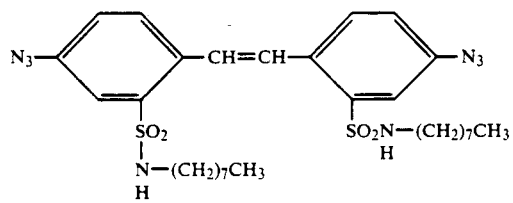

15.0 g of 4,4'-diazidostilbene-2,2'-disulfonychloride was dissolved with stirring in 150 ml of dimethylformamide to obtain a solution. Into the solution, a solution comprising 9.43 g of n-octylamine and 8.39 g of triethylamine was dropped in a temperature range from 15° to 20° C., followed by stirring for 1 hour at room temperature. After triethylamine hydrochloride was filtered from the reaction solution, the solution was poured into a mixture of 400 ml of water and 100 ml of methanol whereby crystals were deposited. The precipitated crystals were filtered and recrystallized from dimethylformamide-water solution to obtain Amide No.9. The Amide No.9 had a melting point of 152° to 153° C. and an HPLC purity of 98.5%, and gave the following spectral data.

Infrared absorption spectra:
3330 cm$^{-1}$: amide group
3000-2900 cm$^{-1}$: octyl group
2120 cm$^{-1}$: azide group
Nuclear magnetic spectra:
0.8 ppm (triplet, 6H: —CH$_3$)
0.9-1.4 ppm (multiplet, 28H: —CH$_2$—)
2.8 ppm (singlet, 2H: —NH—)
7.2-8.1 ppm (multiplet, 8H:

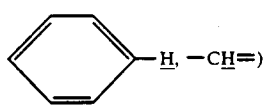

Ultraviolet absorption spectra:
$\lambda_{max}$: 337 nm
$\epsilon_{max}$: 36500

EXAMPLE 10

Amides No.10 to No.16 shown in Table 3 were synthesized using the same procedures as in Example 9.

TABLE 3

| Amide No. | R$_4$ | R$_5$ |
|---|---|---|
| 10 | —CH$_2$CH(CH$_3$)CH$_3$ | H |
| 11 | —(CH$_2$)$_6$CH$_3$ | H |
| 12 | —CH$_2$—CH—(CH$_2$)$_3$—CH$_3$<br>   \|<br>   C$_2$H$_5$ | H |
| 13 | —(CH$_2$)$_9$CH$_3$ | H |
| 14 | —(CH$_2$)$_3$CH$_3$ | CH$_3$ |
| 15* | —(CH$_2$)$_4$CH$_3$ | —(CH$_2$)$_4$CH$_3$ |
| 16 | —(CH$_2$)$_5$CH$_3$ | —(CH$_2$)$_5$CH$_3$ |

*Amide No. 15 (= Formula VIII)

Preparation and test examples of photosensitive resin compositions using the above-described photosensitive agents.

EXAMPLES 11–15

The respective Amides synthesized in Examples 9 and 10 in amounts shown in Table 4 are dissolved in a solution comprising 5 g of polyvinylpyrrolidone (average molecular weight: 320,000) dissolved in 106 g of ethylcellosolve, to evaluate their solubility.

Each of the photosensitive resin compositions was coated onto a sand-blasted aluminum plate to a thickness of 2.0 g/m$^2$ after drying, and dried at 80° C. for 20 minutes. The coated plate was exposed by a 1-kW metal halide lamp from a distance of 20 cm for 30 seconds and developed with water; its sensitivity was measured using the step tablet method (Kodak step tablet No.2).

Further, the coated plate was evaluated for developability with water and checked for occurrence of swelling with water. The results are shown in Table 4.

As reference examples, results for photosensitive resin compositions using sodium and ammonium salts of 4,4'-diazidostilbene-2,2'-disulfonic acid and the following lower alkylamide, arylamide and ester as photosensitive agents are also shown.

TABLE 4

|  | Photosensitive agent | g | Solubility | Sensitivity** | Developability | Swelling |
|---|---|---|---|---|---|---|
| Ex. 11 | Amide No. 9 | 0.274 | Good | 11 | Good | None |
| 12 | Amide No. 10 | 0.220 | Good | 12 | Good | None |
| 13 | Amide No. 11 | 0.261 | Good | 11 | Good | None |
| 14 | Amide No. 14 | 0.237 | Good | 11 | Good | None |
| 15 | Amide No. 15 | 0.298 | Good | 11 | Good | None |
| Ref. 5 | Lower alkyl amide A | 0.213 | Poor | — | — | — |
| 6 | Arylamide B | 0.243 | Poor | — | — | — |
| 7 | Ester C | 0.239 | Good | 10 | partly undeveloped | None |
| 8 | Sodium salt | 0.2 | Fair* | 9 | Good | Present |
| 9 | Ammonium salt | 0.196 | Poor | — | — | — |

*Solubility varied with crystal form
**Gradation scale No. of Kodak step Table No. 2

It can be seen from Table 4 that the photosensitive resin compositions using the first photosensitive agent according to the present invention, unlike those of the Reference Examples, are superior in solubility, sensitivity, and water-developability, with no occurrence of swelling.

SYNTHESIS EXAMPLES FOR PHOTOSENSITIVE AGENTS OF FORMULA (IV)

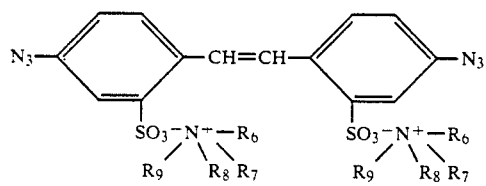

(IV)

EXAMPLE 16

46.75 g of sodium 4,4'-diazidostilbene-2,2'-disulfonate was dissolved in 1,416 ml of water, and the solution passed through a column filled with 180 ml of strong acid ion exchange resin PK-228 (from Mitsubishi Kasei) at a space velocity of 1.5 hr$^{-1}$ to prepare a 4,4'-diazidostilbene-2,2-disulfonic acid aqueous solution. To this solution was added 15% tetramethylammonium hydroxide aqueous solution (hereinafter referred to as TMAH, from Toyo Gosei Kogyo) to adjust the pH to 9, and it was then concentrated to 180 g. The deposited light-yellow crystals were filtered, washed with water, and dried to yield 54.42 g (yield: 96.2%) of the tetramethylammonium salt.

Solubility of this salt is shown in Table 5. The salt had a $\lambda_{max}$ of 335 nm, an $\epsilon_{max}$ of 41,890, and a Na content of 0.5 ppm or less.

EXAMPLE 17

The triethylamine salt of 4,4'-diazidostilbene-2,2'-disulfonic acid was synthesized using the same procedures as in Example 16 (yield: 96.6%). The solubility of this salt is shown in Table 5; it had a $\lambda_{max}$ of 335 nm, an $\epsilon_{max}$ of 41,300, and a Na content of 0.5 ppm or less.

For comparison, solubilities of Na, K, and NH$_4$ salts of 4,4'-diazidostilbene-2,2'-disulfonic acid are shown in Table 5 (Comparative Examples 10–12).

TABLE 5

Solubility of $$N_3-\text{C}_6H_4-CH=CH-\text{C}_6H_4-N_3$$ with $SO_3^-X^+$ on each ring

|  | X$^+$ | Solubility (water, 25° C.) |
|---|---|---|
| Example 16 | Tetramethylammonium | 10% or more |
| 17 | Triethylamine | 10% or more |
| Comparative Example 10 | Na | 3.3% |
| 11 | K | 3.0% |
| 12 | NH$_4$ | 1.8% |

EXAMPLE 18

13.0 g of sodium bis-(4'-azidobenzal)-4-methylcyclohexanone-2,2'-disulfonate was dissolved in 1,500 ml of water, and the solution passed through a column filled with 150 ml of strong acid ion exchange resin PK-228 (from Mitsubishi Kasei) at a space velocity of 3.0 hr$^{-1}$ to desalt, obtaining the sulfonic acid aqueous solution. To this solution was added 15% tetramethylammonium hydroxide aqueous solution (from Toyo Gosei Kogyo) to adjust the pH value to 9, and then concentrated to a total amount of 50 g. The light-red crystals deposited were filtered, washed with water, and dried to yield 14.98 g (yield: 90.5%) of the tetramethylammonium salt. The solubility of this salt is shown in Table 6. The salt had a $\lambda_{max}$ of 383 nm, an $\epsilon_{max}$ of 27,835, and a Na content of 0.5 ppm or less.

EXAMPLE 19

The triethylamine salt of 2,6-bis-(4'-azidobenzal)-4-methyl-cyclohexanone-2,2'-disulfonic acid was synthesized using the same procedures as in Example 17 (yield: 91.0%). The solubility of this salt is shown in Table 6. The salt had a $\lambda_{max}$ of 383 nm, an $\epsilon_{max}$ of 28,741 and a Na content of 0.5 ppm or less.

For comparison, the solubility of the Na salt of 2,6-bis(4'-azidobenzal)-4-methyl-cyclohexanone-2,2'-disulfonic acid is shown in Table 6 (Comparative Example 13).

TABLE 6

Solubility of 2,6-bis(4'-azidobenzal)-4-methylcyclohexanone-2,2'-disulfonate structure with $SO_3^-X^+$ groups

|  | X$^+$ | Solubility (water, 25° C.) |
|---|---|---|
| Example 18 | Tetramethylammonium | 7.0% |
| 19 | Triethylamine | 10% or more |
| Comparative | Na | 0.9% |

TABLE 6-continued

Solubility of $$N_3-\text{\textlangle}\text{\textrangle}-CH\overset{\overset{O}{\|}}{=}CH-\text{\textlangle}\text{\textrangle}-N_3$$
with $SO_3^-X^+$ groups and $CH_3$

| X+ | Solubility (water, 25° C.) |
|---|---|
| Example 13 | |

EXAMPLE 20

A 4,4'-diazidostilbene-2,2'-disulfonic acid aqueous solution was obtained using the same procedures as in Example 15. It was mixed with dibutylamine and the pH value adjusted to 9.0 to deposit crystals. The crystals were filtered, washed with water, and dried to obtain dibutylamine salt of 4,4'-diazidostilbene-2,2'-disulfonic acid (yield: 91.2%). The salt had a $\lambda_{max}$ of 335 nm and an $\epsilon_{max}$ of 40,988. This salt is very low in solubility in water, but is high in compatibility with binder polymers, and is soluble to the extent of 5% or more in an ethylcellosolve solution containing 4.5% polyvinylpyrrolidone.

EXAMPLES 21-22

The compounds shown in Table 7 were prepared using the same procedures as in Example 16, and each compound was measured for solubilities in 2.5% ethylcellosolve and water to obtain the results shown in Table 7.

TABLE 7

Solubilities in solvents of $$N_3-\text{\textlangle}\text{\textrangle}-CH=CH-\text{\textlangle}\text{\textrangle}-N_3$$
with $SO_3^-X^+$ groups

| | X+ | Solubility in 2.5% ethylcellosolve (*) 25° C. | 60° C. | Solubility in water 25° C. |
|---|---|---|---|---|
| Example 21 | Diethylamine | Good | Good | 6.5% |
| 22 | Tetraethyl ammonium | Good | Good | 10% or more |
| Comparative Example 14 | Na | Fair | Good | 3.3% |
| 15 | K | Poor | Poor | 3.0% |
| 16 | NH4 | Poor | Poor | 18% |

(*)Good: completely soluble
Fair: with small amounts of undissolved portion
Poor: with large amounts of undissolved portion It can be seen from Table 7 that the compounds of Examples 21 and 22 have good solubilities compared to the compounds of Comparative Examples 14–16.

EXAMPLE 23

4,4'-diazidostilbene-2,2'-disulfonates (hereinafter referred to as DAZST) were mixed with a 4.5% aqueous solution of polyvinylpyrrolidone (MW=160,000) (from Tokyo Kasei Kogyo), a silane coupling agent SH-6040 (from Toray Silicone), Emulgen 913 (from Kao), water, and isopropyl alcohol in the ratios shown in Table 8 to prepare photosensitive solutions A to D.

Each solution was spin coated on a glass plate and prebaked at 80° C. for 20 minutes. The resulting films had thicknesses of 0.8 μm. Each coated glass plate was exposed by a 15 mW ultra-high-pressure mercury lamp for 7 seconds. According to the measurement results obtained using the step tablet method (Kodak step tablet No.2), these films had almost the same sensitivities. After burning in a clean oven at 180° C., the films were measured for light transmittances for different wavelengths. The results are shown in Table 9.

TABLE 8

| | A*1 | B*2 | C*3 | D*4 |
|---|---|---|---|---|
| DAZST (g) | 0.1017 | 0.1110 | 0.0840 | 0.0822 |
| 4.5% polyvinyl-pyrrolidone aqueous solution (g) | 5.33 | 5.33 | 5.33 | 5.33 |
| Silane coupling agent (g) | 0.16 | 0.16 | 0.16 | 0.16 |
| Emulgen 913 (g) | 0.034 | 0.034 | 0.034 | 0.034 |
| Water (g) | 24.66 | 24.66 | 24.66 | 24.66 |
| Isopropyl alcohol (ml) | 5 | 5 | 5 | 5 |

*1 Tetramethylammonium salt (Example 16)
*2 Triethylamine salt (Example 17)
*3 Sodium salt (Example 10)
*4 Ammonium salt (Example 12)

TABLE 9

| Wavelength (μm) | 440 | 460 | 480 | 500 | 520 |
|---|---|---|---|---|---|
| A | 96.8% | 97.0% | 97.5% | 98.0% | 98.0% |
| B | 96.3 | 96.7 | 97.0 | 97.0 | 97.5 |
| C | 97.0 | 97.4 | 98.0 | 98.0 | 98.0 |
| D | 92.0 | 94.0 | 94.7 | 95.9 | 96.3 |

As shown in Table 9, the inventive compounds of this Example show almost the same transparency as the prior art sodium salt. Thus, the photosensitive compositions according to the present invention are suited for use, for example, as color filter photosensitive material which requires high heat resistance and transparency and low metallic properties.

EXAMPLE 24

Photosensitive resin compositions were prepared using the photosensitive agents of general formulas (V) to (XI) shown below which were obtained in Examples 1, 8, 9, 10, 16, 20, and 22. Each of the photosensitive resin compositions is coated using a spinner onto a glass substrate and dried at 80° C. for 20 minutes to form a photosensitive film of 1.0 μm in thickness. The photosensitive film was imagewise exposed using a high-pressure mercury lamp, and developed with water to obtain a sharp image with no swelling.

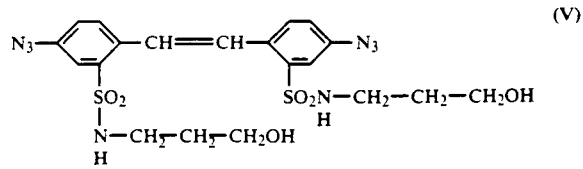

(V)

-continued

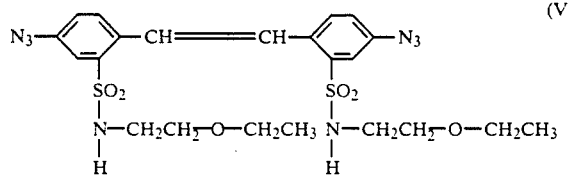
(VI)

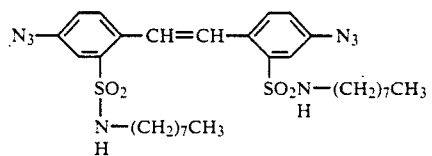
(VII)

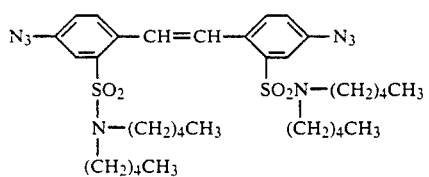
(VIII)

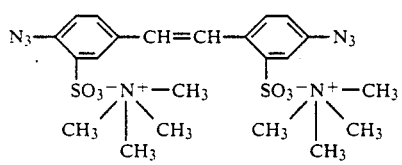
(IX)

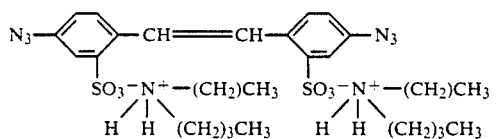
(X)

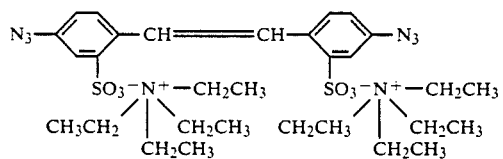
(XI)

We claim:

1. A photosensitive agent comprising an aromatic diazide compound represented by Formula (1)

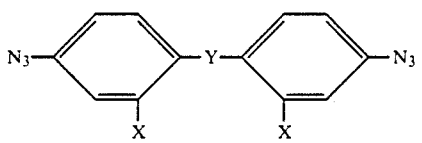
(I)

wherein
X denotes

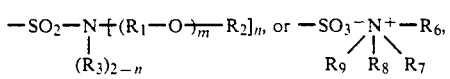

Y denotes —CH=CH—,

TABLE 2

| | Photosensitive agent | g | Solubility | Sensitivity** | Developability | Swelling |
|---|---|---|---|---|---|---|
| Ex. 3 | Amide No. 1 | 0.227 | Good | 13 | Good | None |
| 4 | Amide No. 2 | 0.215 | Good | 11 | Good | None |
| 5 | Amide No. 3 | 0.239 | Good | 12 | Good | None |
| 6 | Amide No. 4 | 0.254 | Good | 11 | Good | None |
| 7 | Amide No. 7 | 0.239 | Good | 12 | Good | None |
| 8 | Amide No. 8 | 0.239 | Good | 13 | Good | None |
| Ref. 1 | Arylamide A | 0.243 | Poor | — | — | — |
| 2 | Ester B | 0.239 | Good | 10 | partly undeveloped | None |
| 3 | Sodium salt | 0.2 | Fair* | 9 | Good | Present |
| 4 | Ammonium salt | 0.196 | Poor | — | — | — |

*Solubility varied with crystal form
**Gradation scale No. of Kodak step Table No. 2

Y denotes —CH=CH—, —CH=CH—C—CH=CH—, or
$$\qquad\qquad\qquad\qquad\qquad\quad\underset{O}{\|}$$

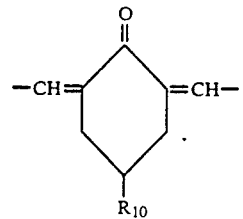

$R_1$ is —$CH_2CH_2$—, $R_2$ —$CH_2CH_3$, $R_3$ is hydrogen, m is 1, and n is 1, $R_6$, $R_7$, $R_8$, $R_9$, and $R_{10}$ are individually hydrogen, alkyl, substituted alkyl, aryl, or two of $R_6$ to $R_9$ form alkylene groups, provided that $R_6$ to $R_9$ are not all hydrogen simultaneously.

2. A photosensitive agent comprising an aromatic diazide compound represented by Formula (I)

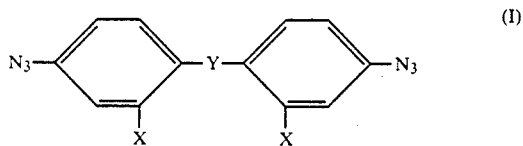
(I)

wherein
X denotes

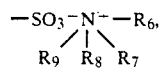

Y denotes —CH=CH—, $R_6$, $R_7$, $R_8$, $R_9$, and $R_{10}$ are individually hydrogen, alkyl, substituted alkyl, aryl, or two of $R_6$ to $R_9$ form alkylene groups, provided that $R_6$ to $R_9$ are not all hydrogen simultaneously.

3. The photosensitive agent of claim 2 wherein $R_6$, $R_7$, $R_8$ and $R_9$ are each —$CH_3$.

4. The photosensitive agent of claim 2 wherein $R_6$ and $R_7$ are each —$(CH_2)_3CH_3$, and $R_8$ and $R_9$ are hydrogen.

5. The photosensitive agent of claim 2 wherein $R_6$, $R_7$, $R_8$ and $R_9$ are each —$CH_2CH_3$.

* * * * *